(12) United States Patent
Tsutsui et al.

(10) Patent No.: US 11,528,012 B2
(45) Date of Patent: Dec. 13, 2022

(54) ACTIVE BALUN CIRCUIT, POWER AMPLIFIER CIRCUIT, AND POWER AMPLIFIER MODULE

(71) Applicant: Murata Manufacturing Co., Ltd., Kyoto (JP)

(72) Inventors: Takayuki Tsutsui, Kyoto (JP); Satoshi Tanaka, Kyoto (JP); Kiichiro Takenaka, Kyoto (JP); Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 65 days.

(21) Appl. No.: 17/089,766

(22) Filed: Nov. 5, 2020

(65) Prior Publication Data
US 2021/0135657 A1    May 6, 2021

(30) Foreign Application Priority Data

Nov. 6, 2019  (JP) .............................. JP2019-201272
Jul. 3, 2020   (JP) .............................. JP2020-115846

(51) Int. Cl.
*H03F 3/21* (2006.01)
*H03H 11/32* (2006.01)
*H03F 3/45* (2006.01)

(52) U.S. Cl.
CPC ............... *H03H 11/32* (2013.01); *H03F 3/21* (2013.01); *H03F 2200/06* (2013.01)

(58) Field of Classification Search
CPC ....... H03H 11/32; H03F 3/21; H03F 2200/06; H03F 3/211; H03F 3/602; H03F 2200/09;
(Continued)

(56) References Cited

U.S. PATENT DOCUMENTS 6,922,108 B2 *  7/2005  Lin ........................ H03H 11/32
                                                                 330/306
9,401,770 B1 *  7/2016  Noll ....................... H04H 20/63
(Continued)

FOREIGN PATENT DOCUMENTS

JP     2006-157483 A     6/2006
JP     2009-088770 A     4/2009

OTHER PUBLICATIONS

Hwan et al., "Power-Combining Transformer Techniques for Fully-Integrated CMOS Power Amplifiers", IEEE Journal of Solid-State Circuits, Institute of Electrical and Electronics Engineers, vol. 43, No. 5, p. 1064-1075, May 2008.

*Primary Examiner* — Hieu P Nguyen
(74) *Attorney, Agent, or Firm* — Pearne & Gordon LLP

(57) ABSTRACT

An active balun circuit includes first and second transistors having emitters electrically coupled to each other and configured to output differential signals and a circuit element coupled between the connection point of the emitter of the first transistor and the emitter of the second transistor and a reference potential. The impedance of the circuit element at a particular frequency of the input signal appears significantly larger than impedances at other frequencies. An input signal from an input terminal is inputted to the base of the first transistor. The reference potential is applied to the base of the second transistor. A supply voltage is applied to the collector of the first transistor and the collector of the second transistor. A signal from the collector of the first transistor and a signal from the collector of the second transistor are outputted as the differential signals.

17 Claims, 21 Drawing Sheets

(58) Field of Classification Search
CPC ..... H03F 2200/451; H03F 2203/45731; H03F 3/45085; H03F 3/20
USPC .......................................... 330/301, 252–261
See application file for complete search history.

(56) References Cited

U.S. PATENT DOCUMENTS

2009/0085666 A1    4/2009    Ohnishi et al.
2010/0197244 A1    8/2010    Gomez et al.

\* cited by examiner

US 11,528,012 B2

ACTIVE BALUN CIRCUIT, POWER AMPLIFIER CIRCUIT, AND POWER AMPLIFIER MODULE

CROSS REFERENCE TO RELATED APPLICATION

This application claims priority from Japanese Patent Application No. 2019-201272 filed on Nov. 6, 2019 and Japanese Patent Application No. 2020-115846 filed on Jul. 3, 2020. The contents of these applications are incorporated herein by reference in its entirety.

BACKGROUND

The present disclosure relates to an active balun circuit, a power amplifier circuit, and a power amplifier module.

In some known technologies, a balun implemented as a differential transformer circuit is provided in the input or output stage of an amplifier of a power amplifier circuit. A configuration in which a balun is provided in the output stage of an amplifier is illustrated in FIG. 18(a) in Kyu Hwan An et al., "Power-Combining Transformer Techniques for Fully-Integrated CMOS Power Amplifiers", United States, IEEE Journal of Solid-State Circuits, Institute of Electrical and Electronics Engineers, May 2008, Volume: 43, Issue: 5, p. 1064-1075.

BRIEF SUMMARY

It is considered to provide a balun implemented by using a transformer circuit constituted by passive elements together with a power amplifier circuit in a semiconductor chip. In this case, when inductors required for the balun are formed at the semiconductor chip, the area of the semiconductor chip increases.

The present disclosure implements an active balun circuit, a power amplifier circuit, and a power amplifier module in which the increase in the area of a semiconductor chip is suppressed.

An active balun circuit according to an aspect of the present disclosure includes a first transistor and a second transistor that are configured to output a pair of differential signals corresponding to an input signal and a circuit element that is configured to have an impedance at a particular frequency of the input signal, the impedance appearing significantly larger than impedances at other frequencies.

An active balun circuit according to another aspect of the present disclosure includes a first transistor including a first terminal coupled to a reference potential via a circuit element, a second terminal coupled to an input terminal, and a third terminal coupled to a supply voltage terminal and a second transistor including a first terminal coupled to the reference potential via the circuit element, a second terminal coupled to the reference potential, and a third terminal coupled to the supply voltage terminal. The first terminal of the first transistor is a source or drain. The second terminal of the first transistor is a gate. The third terminal of the first transistor is a drain or source. The first terminal of the second transistor is a source or drain. The second terminal of the second transistor is a gate. The third terminal of the second transistor is a drain or source. The first transistor and the second transistor are configured to output the pair of differential signals from the third terminal of the first transistor and the third terminal of the second transistor.

The present disclosure can provide an active balun circuit in which the increase in the area of a semiconductor chip is suppressed, and a power amplifier circuit and a power amplifier module including the same.

Other features, elements, characteristics and advantages of the present disclosure will become more apparent from the following detailed description of embodiments of the present disclosure (with reference to the attached drawings).

DETAILED DESCRIPTION

Hereinafter, embodiments of an active balun circuit of this disclosure are described in detail with reference to the drawings. It should be noted that the embodiments do not limit the present disclosure. In addition, the constituent elements of the embodiments may include elements easily replaceable by those skilled in the art or substantially identical to each other. The embodiments are mere examples and the configurations described in the different embodiments may be partially replaced or combined with each other. In second and subsequent embodiments, descriptions about specifics common to a first embodiment are not repeated and only different points are explained. In particular, almost identical effects and advantages achieved by almost identical configurations are not mentioned in every embodiment.

Hereinafter, an active balun circuit of the present disclosure is described. The active balun circuit of the present disclosure does not use any wire winding inductor, unlike a balun implemented as a differential transformer circuit. To facilitate understanding of the embodiments, a power amplifier circuit including a balun implemented as a differential transformer circuit is firstly explained as a comparative example.

Comparative Example

Circuit Configuration

Figure 1:
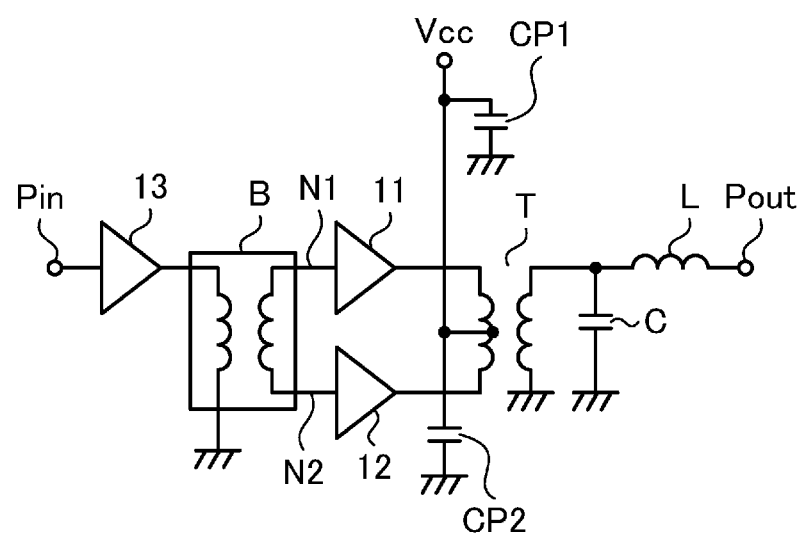
FIG. 1 illustrates a power amplifier circuit including a balun.

FIG. 1 illustrates a power amplifier circuit including a balun. The power amplifier circuit illustrated in FIG. 1 includes a balun B implemented as a transformer circuit using wire winding inductors. The balun B is provided between nodes N1 and N2 on the input side of a pair of amplifiers 11 and 12 in the final stage and an amplifier 13 in the preceding stage. On the output side of the pair of amplifiers 11 and 12, a transformer T and a filter constituted by an inductor L and a capacitor C are provided. A primary winding of the transformer T is connected at a midpoint to a supply voltage Vcc. Capacitors CP1 and CP2 are coupled in an electrically separated manner between the midpoint of the primary winding of the transformer T and a reference potential and function as bypass capacitors. The reference potential is exemplified by a ground potential, but the present disclosure is not limited to this example.

Operation

A signal, for example, a radio frequency (RF) signal, inputted to an input terminal Pin, is amplified by the amplifier 13 and inputted to the balun B. The balun B provides differential outputs for the nodes N1 and N2. The differential outputs from the nodes N1 and N2 are amplified by the amplifiers 11 and 12. The outputs from the amplifiers 11 and 12 are outputted to an output terminal Pout via the transformer T and the filter constituted by the inductor L and the capacitor C. In this comparative example, since the balun B is provided between the stages, the final stage of the amplifiers 11 and 12 and the preceding stage of the amplifier 13 can be separated from each other, and furthermore, differential outputs can be obtained.

If the power amplifier circuit of the comparative example described with reference to FIG. 1 is implemented as a semiconductor chip, the area of the semiconductor chip increases due to the balun B. Accordingly, it is difficult to reduce the overall area of the semiconductor chip in the power amplifier circuit in the comparative example.

First Embodiment

Circuit Configuration

Figure 2:
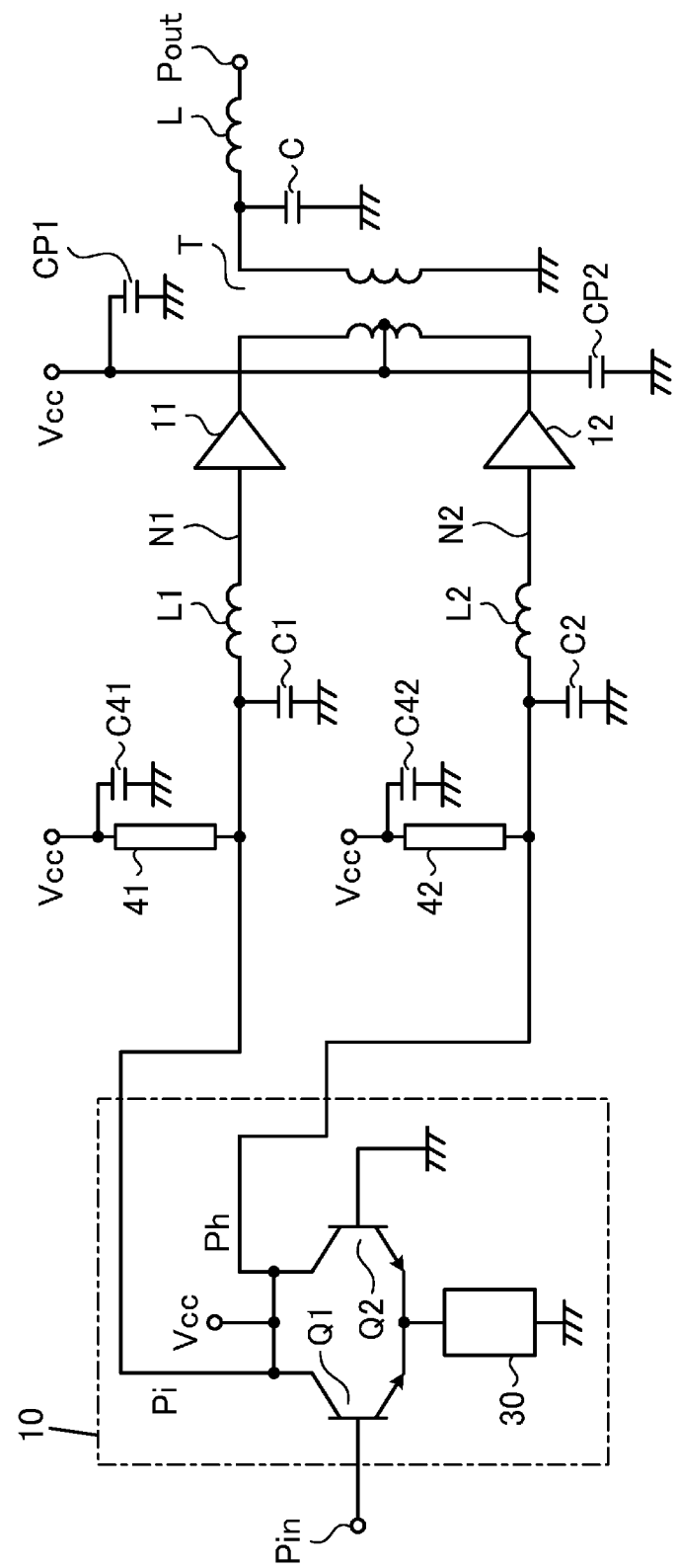
FIG. 2 illustrates an example of a power amplifier circuit including an active balun circuit.

FIG. 2 illustrates an example of a power amplifier circuit including an active balun circuit. As illustrated in FIG. 2, an active balun circuit 10 is provided between the input terminal Pin and the nodes N1 and N2 on the input side of the pair of amplifiers 11 and 12.

The active balun circuit 10 includes a transistor Q1 as a first transistor, a transistor Q2 as a second transistor, and a circuit element 30. The transistor Q1 and Q2, each includes an emitter as a first terminal, a base as a second terminal, and a collector as a third terminal. The active balun circuit 10 is not a balun including winding inductors but a balun implemented by using the transistors Q1 and Q2 and the circuit element 30.

The input terminal Pin is coupled to the base of the transistor Q1. The base of the transistor Q2 is coupled to a reference potential. The reference potential is exemplified by a ground potential, but the present disclosure is not limited to this example. The emitter of the transistor Q1 and the emitter of the transistor Q2 are coupled to each other and the connection point of the emitter of the transistor Q1 and the emitter of the transistor Q2 is coupled to one end of the circuit element 30. The other end of the circuit element 30 is coupled to the reference potential. The collector of the transistor Q1 and the collector of the transistor Q2 are coupled to the supply voltage Vcc.

A signal Pi of the collector of the transistor Q1 and a signal Ph of the collector of the transistor Q2 are a pair of differential signals. The signal Pi of the collector of the transistor Q1 is inputted to the amplifier 11 via a filter constituted by an inductor L1 and a capacitor C1. A wire 41 and a capacitor C41 function as a matching circuit. The signal Ph of the collector of the transistor Q2 is inputted to the amplifier 12 via a filter constituted by an inductor L2 and a capacitor C2. A wire 42 and a capacitor C42 function as a matching circuit.

The transistors Q1 and Q2 are exemplified by NPN-type transistors, but this disclosure is not limited to this example. The transistors Q1 and Q2 may also be PNP-type transistors.

In addition, in the present disclosure, the transistors are bipolar transistors, but this disclosure is not limited to this example. The bipolar transistor is exemplified by the heterojunction bipolar transistor (HBT), but this disclosure is not limited to this example. The transistors may be, for example, a field effect transistor (FET). In this case, the collector is substituted for the drain, the base is substituted for the gate, and the emitter is substituted for the source; accordingly, it can be said that the first terminal is the emitter or the source, the second terminal is the base or the gate, and the third terminal is the collector or the drain.

The transistors may be multi-finger transistors formed by coupling a plurality of unit transistors (also referred to as fingers) electrically in parallel with each other. The unit transistor is the minimum unit in which a transistor is formed.

The circuit element 30 includes, for example, at least one of a wire of a particular length, an inductor, a capacitor, and a resistor. The circuit element 30 can be said as an impedance element. The circuit element 30 can have a high impedance at a fundamental frequency of the input signal.

The impedance of the circuit element 30 can appear high at the fundamental frequency; in other words, the impedance of the circuit element 30 at a particular frequency of the input signal can appear sufficiently larger than impedances at other frequencies. However, the impedance of the circuit element 30 appears large only when the power amplifier circuit does not oscillate.

Figure 3:
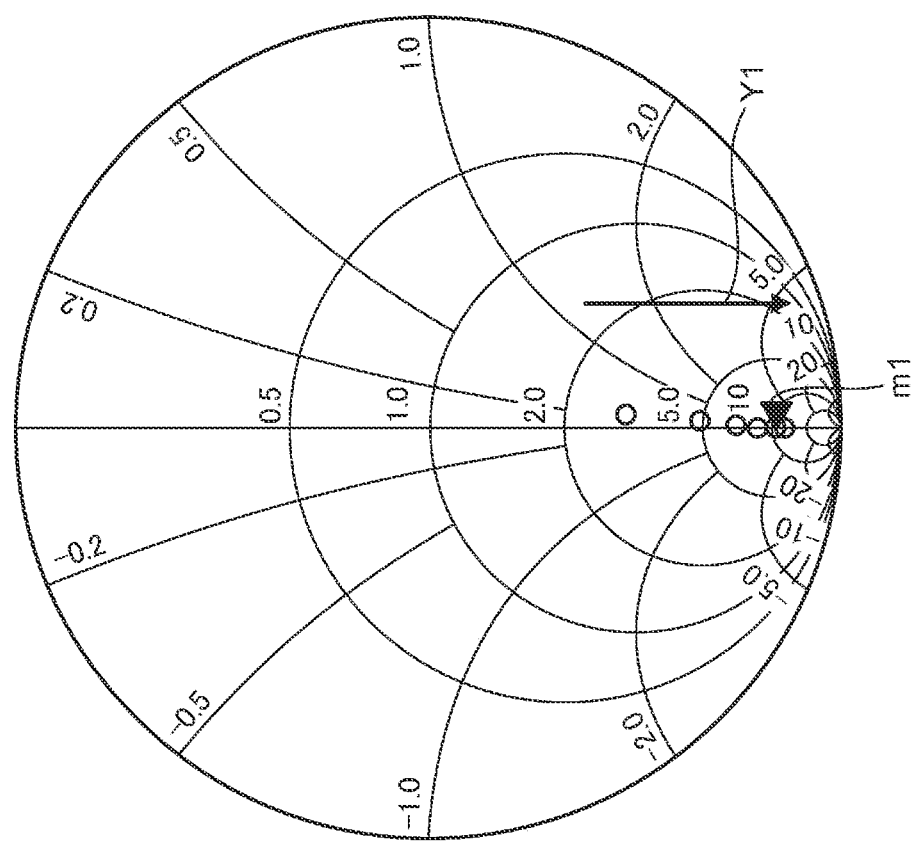
FIG. 3 is a Smith chart illustrating an example of impedance when a circuit element in FIG. 2 is a resistor.

FIG. 3 is a Smith chart illustrating an example of impedance when the circuit element 30 is a resistor. When the frequency is changed from 1.930 GHz to 1.950 GHz, the impedance value normalized with a 50Ω characteristic impedance is changed as indicated by circles and an arrow Y1 in FIG. 3. At a point m1 of the 1.950 GHz frequency indicates a 540Ω impedance, which is approximately tenfold of 50Ω. Accordingly, it can be said that the impedance appears sufficiently large.

Figure 4:
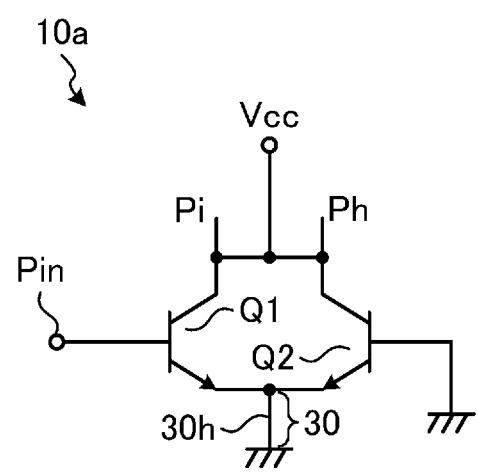
FIG. 4 illustrates a reference example of an active balun circuit.

Here, a case in which the circuit element 30 is a wire is described. FIG. 4 illustrates an active balun circuit 10a of a reference example. The active balun circuit 10a illustrated in FIG. 4 includes a wire 30h as the circuit element 30. As a result, the connection point of the emitter of transistor Q1 and the emitter of transistor Q2 is electrically coupled to the reference potential via the wire 30h. The active balun circuit 10a illustrated in FIG. 4 does not include a transformer circuit using wire winding inductors. For this reason, the area of the semiconductor chip can be reduced by using the active balun circuit 10a for the power amplifier circuit.

Operation

Figure 5:
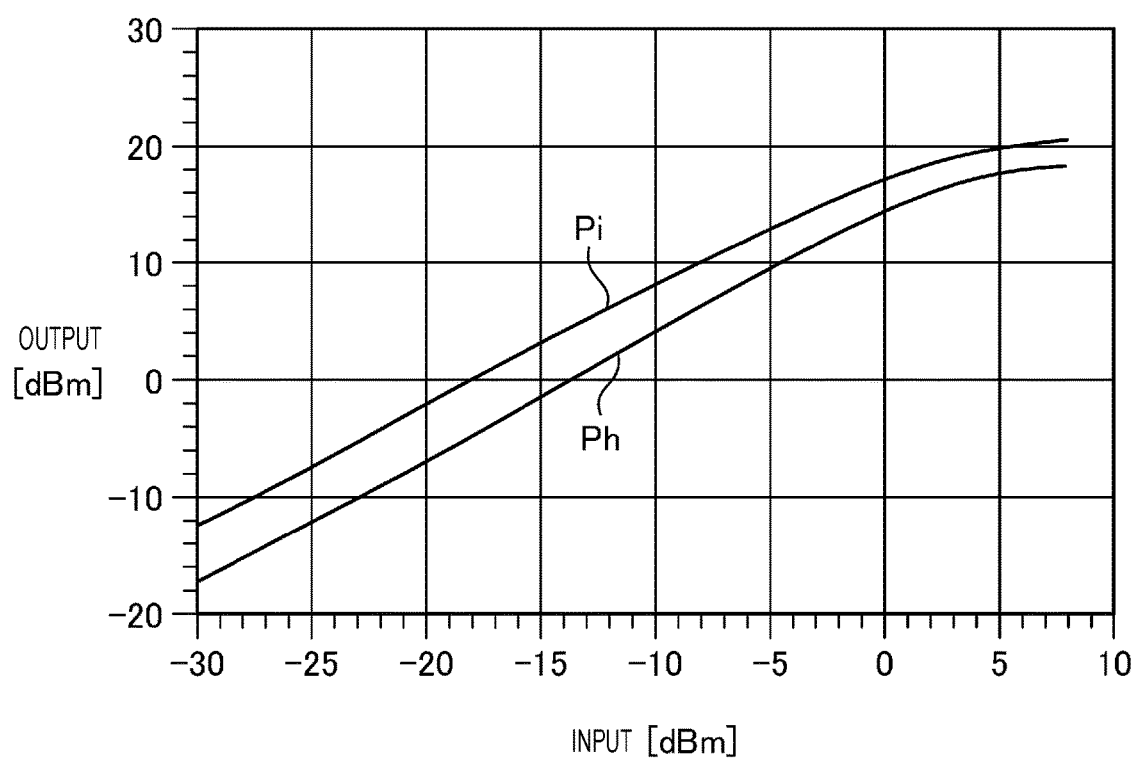
FIG. 5 is a graph illustrating a characteristic of a power amplifier circuit using the active balun circuit of the reference example illustrated in FIG. 4.

FIGS. 5 to 8 are graphs illustrating characteristics of a power amplifier circuit using the active balun circuit 10a of the reference example illustrated in FIG. 4. FIG. 5 is a graph illustrating characteristics observed at the nodes N1 and N2 in FIG. 2 when the active balun circuit 10a of the reference example illustrated in FIG. 4 is used in the power amplifier circuit illustrated in FIG. 2.

FIG. 5 illustrates the relationship between the level of the signal Pi at the node N1 and the level of the signal Ph at the node N2 with respect to the level of the input signal at the input terminal Pin. In FIG. 5, when the level of the input signal at the input terminal Pin changes, the level of the signal Pi and the level of the signal Ph change in a similar manner. As illustrated in FIG. 5, there is a difference between the level of the signal Pi and the level of the signal Pi, and thus, the signals Pi and Ph are differential signals of unbalanced amplitudes. "Unbalanced" in this disclosure is defined as the condition in which the phase difference is inconstant regardless of the level of the input signal or the amplitude is not outputted in proportion to the level of the input signal. By contrast, "balanced" is defined as the condition in which the phase difference is constant regardless of the level of the input signal or the amplitude is outputted in proportion to the level of the input signal.

Figure 6:
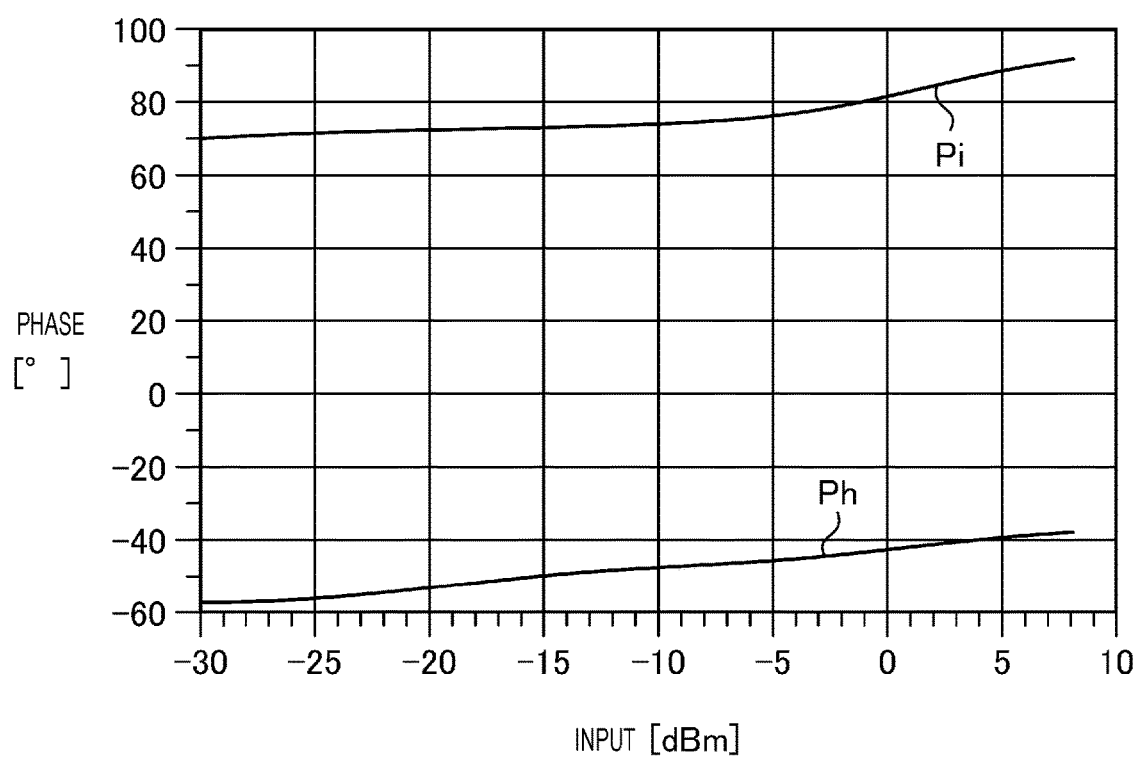
FIG. 6 is a graph illustrating a characteristic of the power amplifier circuit using the active balun circuit of the reference example illustrated in FIG. 4.
Figure 7:
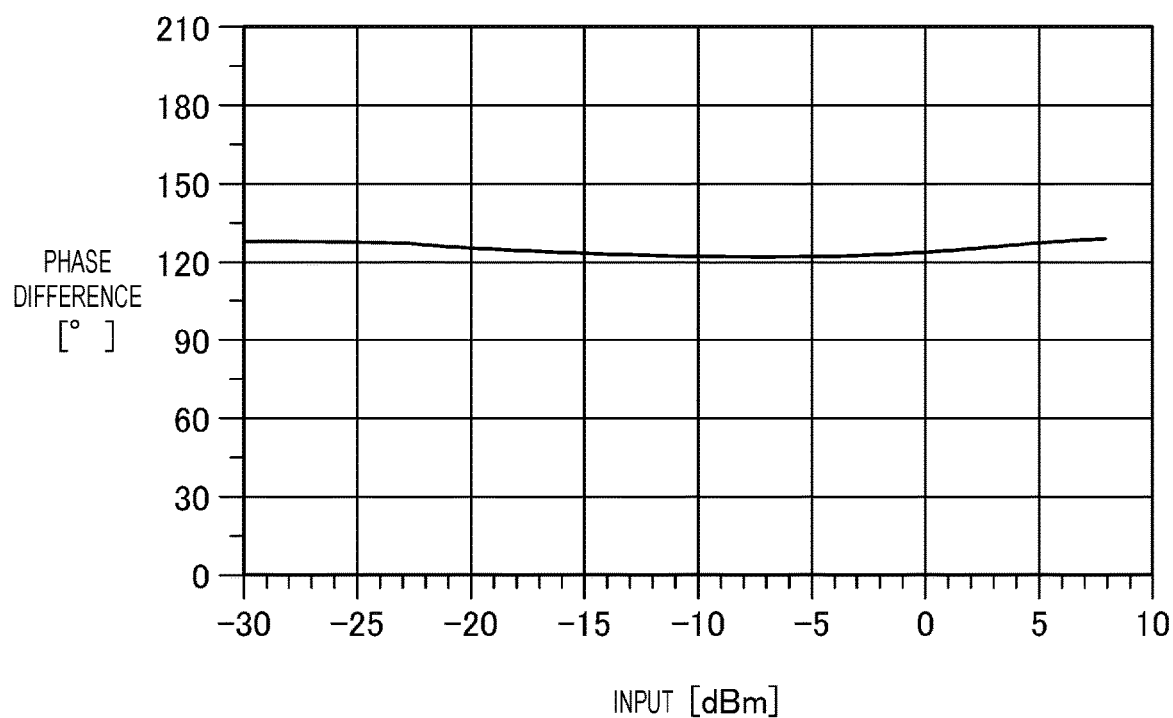
FIG. 7 is a graph illustrating a characteristic of the power amplifier circuit using the active balun circuit of the reference example illustrated in FIG. 4.

FIG. 6 illustrates the relationship of phase change between the signals Pi and Ph with respect to the level of the input signal at the input terminal Pi. FIG. 7 illustrates the relationship of phase difference between the signals Pi and Ph with respect to the level of the input signal at the input terminal Pin. The phase difference between the differential signals Pi and Ph can be 180°. As seen from FIGS. 6 and 7, the phase difference between the signals Pi and Ph is approximately 130°, which is deviated from 180°.

Figure 8:
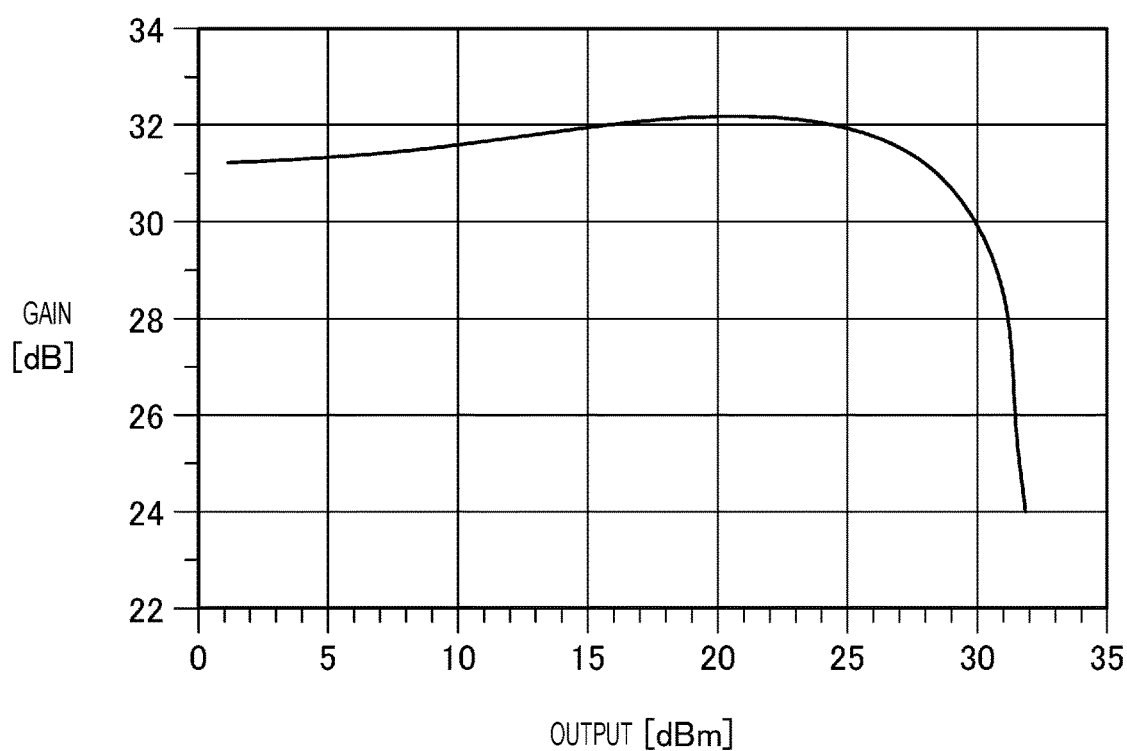
FIG. 8 is a graph illustrating a characteristic of the power amplifier circuit using the active balun circuit of the reference example illustrated in FIG. 4.

FIG. 8 illustrates the relationship between the level of the signal at the output terminal Pout and the gain of the power amplifier circuit. The signals Pi and Ph indicate a phase difference deviated from 180°, although the differential transformer circuit performs phase synthesis for output matching by changing the phase difference from 180° to zero; in addition, the signals Pi and Ph are differential signals outputted in an unbalanced manner. As a result, the two individual transistors in the output stage cannot be driven under optimum load condition; and consequently, the transistors operate in a load operation state in which it is impossible to provide desired saturation outputs that the output stage for the differential amplifiers is required to provide. Hence, as illustrated in FIG. 8, when the signal at the output terminal Pout exceeds 25 dBm, the gain starts decreasing and steeply drops afterwards. Thus, in the active balun circuit 10a of the reference example illustrated in FIG. 4, the two separated transistors Q1 and Q2 in the output stage cannot be driven under the optimum load condition. However, by using the active balun circuit 10a of the reference example illustrated in FIG. 4, the power amplifier circuit properly operates.

Effects

Unlike the balun B illustrated in FIG. 1, the active balun circuit 10a described with reference to FIG. 2 does not include a transformer circuit using wire winding inductors. For this reason, the increase in the area of the semiconductor chip can be suppressed by using the active balun circuit 10a for the power amplifier circuit.

Second Embodiment

Circuit Configuration

Figure 9:
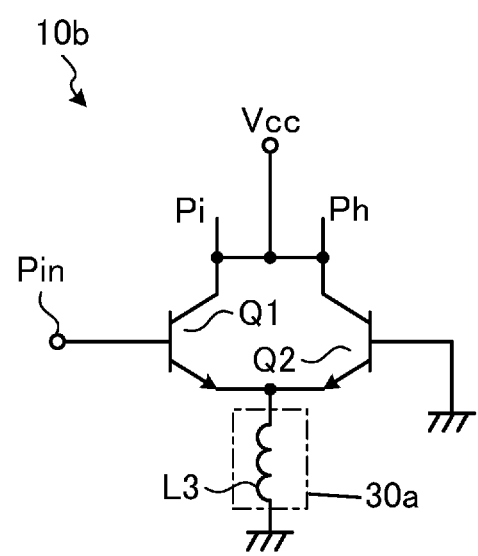
FIG. 9 illustrates an example of another active balun circuit.

FIG. 9 illustrates an example of another active balun circuit 10b. The active balun circuit 10b illustrated in FIG. 9 includes a circuit element 30a as compared to the active balun circuit 10a illustrated in FIG. 4. The active balun circuit 10b is not a balun including winding inductors but a balun implemented by using the transistors Q1 and Q2 and the circuit element 30a. The connection point of the emitter of the transistor Q1 and the emitter of the transistor Q2 is coupled to one end of the circuit element 30a. Unlike the circuit configuration illustrated in FIG. 4, the circuit element 30a is constituted by an inductor L3. As a result, the connection point of the emitter of transistor Q1 and the emitter of transistor Q2 is coupled to the reference potential via the inductor L3.

The inductance value of the inductor L3 is set at a sufficiently large value chosen from a range in which the impedance of the fundamental wave of the circuit element 30a does not fluctuate at the fundamental frequency. When the circuit element 30a is formed at a semiconductor chip, the length of the wire can be set in, for example, micrometer unit. For this reason, the impedance required at the fundamental wave can be easily achieved. For example, at the 2 GHz fundamental frequency, the inductance value of the inductor L3 is approximately 5.13 nH.

Figure 10:
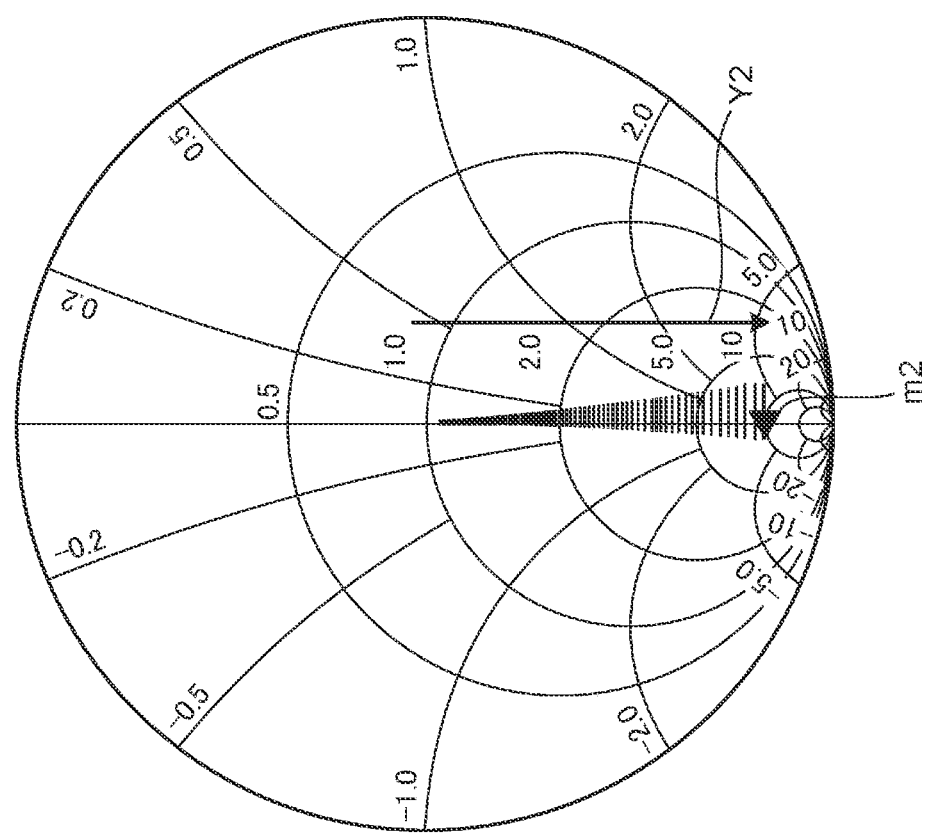
FIG. 10 is a Smith chart illustrating an example of impedance when a circuit element in FIG. 9 is an inductor.

FIG. 10 is a Smith chart illustrating an example of impedance when the circuit element 30a in FIG. 9 is the inductor L3. When the frequency is changed from 1.930 GHz to 1.950 GHz, the normalized impedance value normalized with the 50Ω characteristic impedance is changed as indicated by short lines and an arrow Y2 in FIG. 10. At a point m2 of the 1.950 GHz frequency indicates a 516Ω impedance, which is approximately tenfold of 50Ω. Accordingly, it can be said that the impedance appears sufficiently large.

Operation

Figure 11:
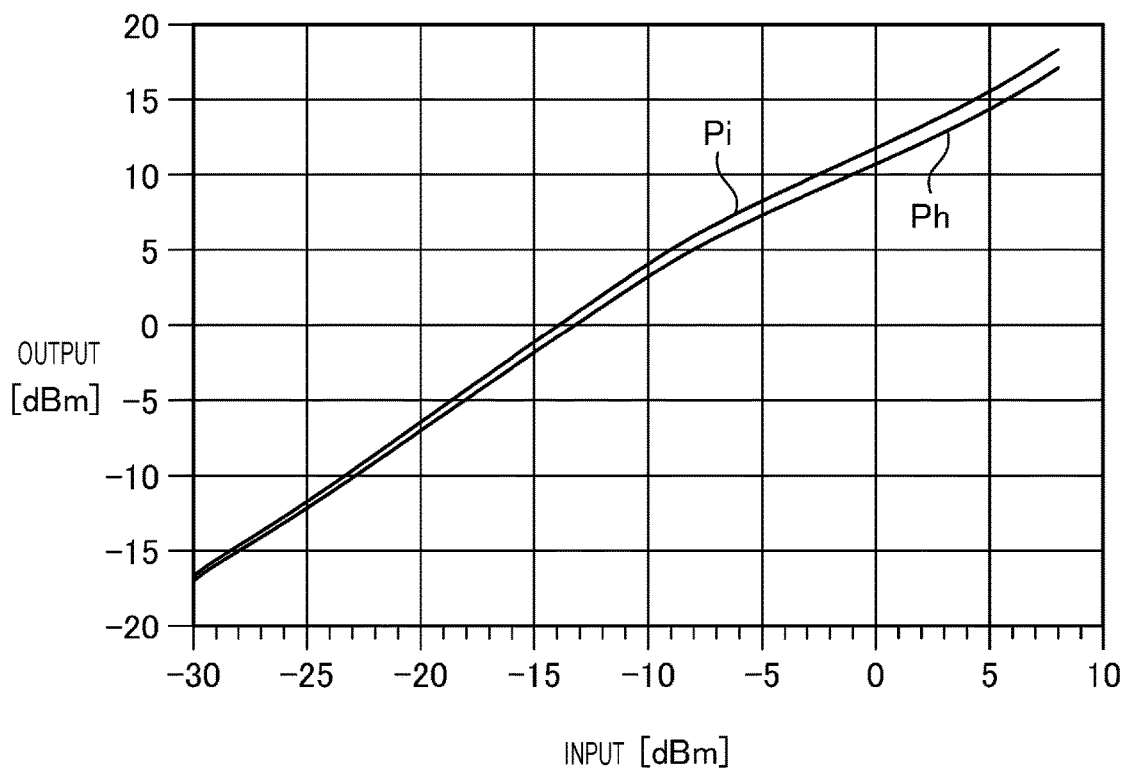
FIG. 11 is a graph illustrating a characteristic of a power amplifier circuit using the active balun circuit illustrated in FIG. 9.

FIGS. 11 to 14 are graphs illustrating characteristics of a power amplifier circuit using the active balun circuit 10b illustrated in FIG. 9. FIG. 11 is a graph illustrating characteristics observed at the nodes N1 and N2 in FIG. 2 when the active balun circuit 10b illustrated in FIG. 9 is used in the power amplifier circuit illustrated in FIG. 2.

FIG. 11 illustrates the relationship between the level of the signal Pi at the node N1 and the level of the signal Ph at the node N2 with respect to the level of the input signal at the input terminal Pin. In FIG. 11, when the level of the input signal at the input terminal Pin changes, the level of the signal Pi and the level of the signal Ph change in a similar manner. Since the signals Pi and Ph are differential signals, the signals Pi and Ph can be identical in level to each other. When FIG. 11 is compared to FIG. 5, the difference between the level of the signal Pi and the level of the signal Ph is relatively small and the unbalanced state of the amplitudes of the signals Pi and Ph is improved. Thus, the differential signals can achieve the symmetry.

Figure 12:
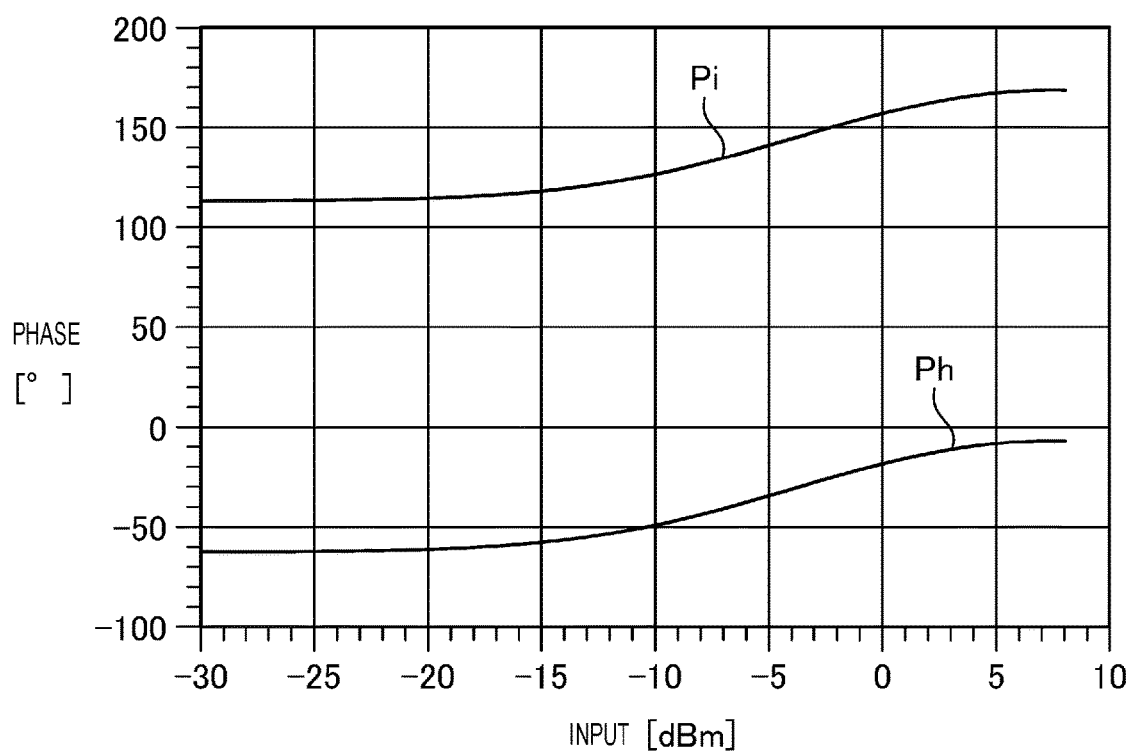
FIG. 12 is a graph illustrating a characteristic of the power amplifier circuit using the active balun circuit illustrated in FIG. 9.
Figure 13:
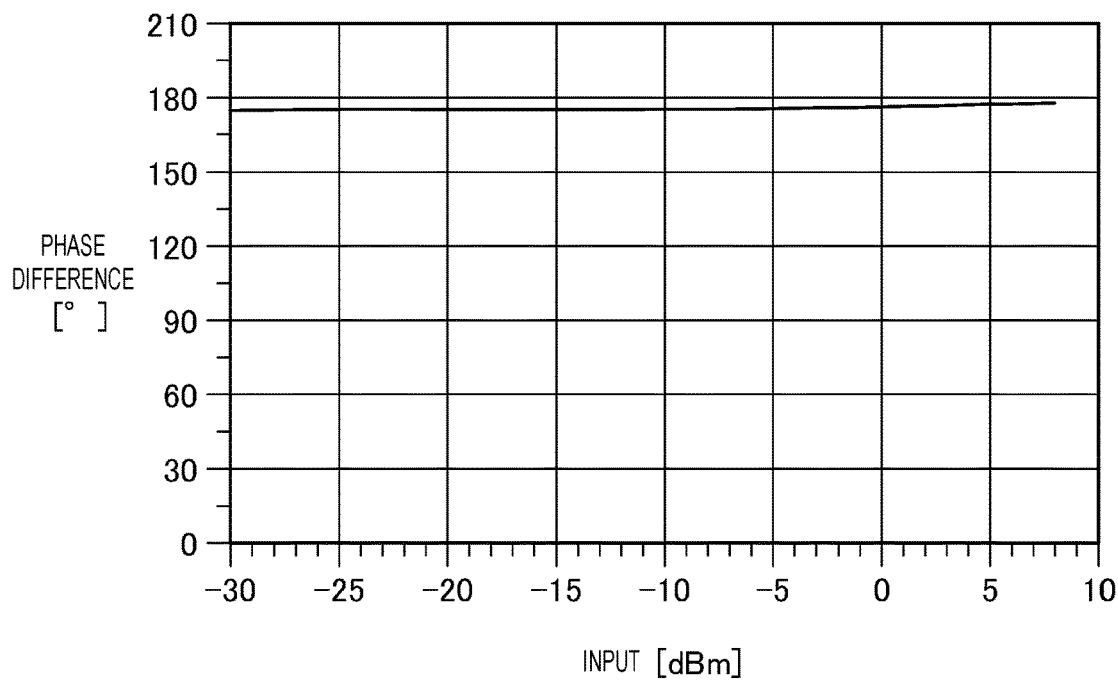
FIG. 13 is a graph illustrating a characteristic of the power amplifier circuit using the active balun circuit illustrated in FIG. 9.

FIG. 12 illustrates the relationship of phase change between the signals Pi and Ph with respect to the level of the input signal at the input terminal Pi. FIG. 13 illustrates the relationship of phase difference between the signals Pi and Ph with respect to the level of the input signal at the input terminal Pin. As can be seen from FIGS. 12 and 13, the phase difference between the signals Pi and Ph is close to 180°. Accordingly, in comparison to the case in FIGS. 6 and 7, the phase difference between the signals Pi and Ph is improved. Furthermore, unlike the active balun having the configuration in FIG. 4, in the active balun having the configuration in FIG. 9, the phase of the signal Pi and the phase of the signal Ph change in a similar manner when the input level of the input signal changes. As a result, the phase difference can always be constant when the input signal changes, and additionally, the phase difference is maintained to be close to 180°.

Figure 14:
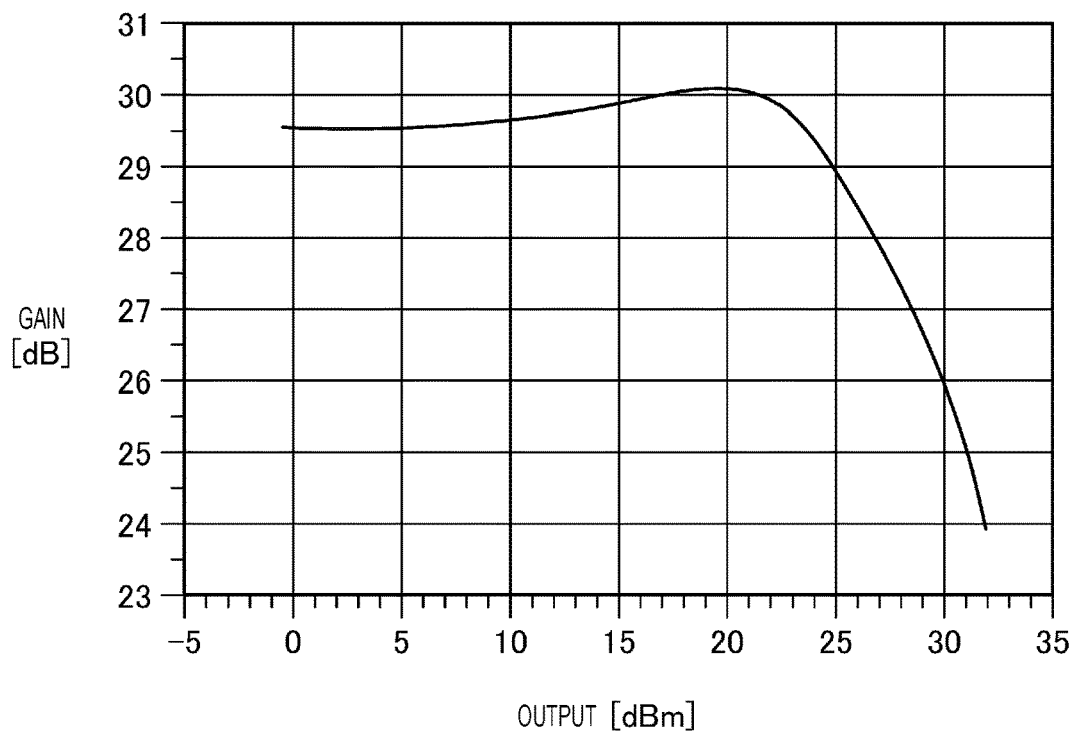
FIG. 14 is a graph illustrating a characteristic of the power amplifier circuit using the active balun circuit illustrated in FIG. 9.

FIG. 14 illustrates the relationship between the level of the signal at the output terminal Pout and the gain of the power amplifier circuit. As illustrated in FIG. 14, when the signal at the output terminal Pout exceeds 20 dBm, the gain starts decreasing and steeply drops afterwards. According to a third embodiment, which will be described below, this sharp drop of gain can be improved.

The unbalanced state of the amplitudes of the signals Pi and Ph is improved as described with reference to FIG. 11, and furthermore, the phase difference between the signals Pi and Ph is improved as described with reference to FIGS. 12 and 13.

Effects

Unlike the balun B illustrated in FIG. 1, the active balun circuit 10b does not include a transformer circuit using wire winding inductors. The area of the wire inductor used in the active balun circuit 10b can be configured to be much smaller than the area of the balun B constituted by a complex wiring transformer circuit. For this reason, the increase in the area of the semiconductor chip can be suppressed by using the active balun circuit 10b for the power amplifier circuit.

When the balun is formed at a semiconductor chip, there are certain process constraints on the number of wiring layer, the thickness of dielectric film, and the like to form the balun, and hence, forming a high-performance balun may result in the increase in process costs due to, for example, the increase in the number of masks and the like. in this regard, the active balun circuit 10b can avoid the increase in costs. Furthermore, the active balun circuit 10b can reduce the level difference between the differential signals to be outputted and also can improve the phase difference between the differential signals as compared to the case of the active balun circuit 10a.

Third Embodiment

Circuit Configuration

Figure 15:
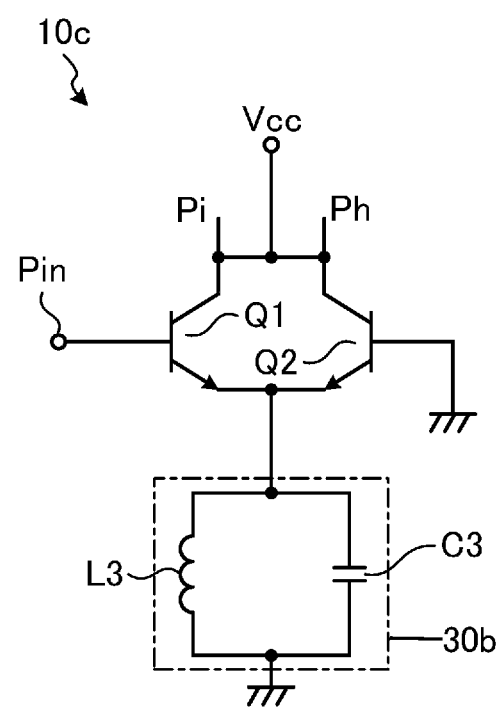
FIG. 15 illustrates an example of another active balun circuit.

FIG. 15 illustrates an example of an active balun circuit 10c. The active balun circuit 10c illustrated in FIG. 15 includes a circuit element 30b. The active balun circuit 10c is not a balun including winding inductors but a balun implemented by using the transistors Q1 and Q2 and the circuit element 30b. The connection point of the emitter of the transistor Q1 and the emitter of the transistor Q2 is coupled to one end of the circuit element 30b. Unlike the first and second embodiments, the circuit element 30b is composed of the inductor L3 and a capacitor C3. The inductor L3 and the capacitor C3 are coupled in parallel between the emitter of the transistor Q1 and the emitter of the transistor Q2 and the reference potential. The inductor L3 and the capacitor C3 forms a parallel resonant circuit (tank circuit). The inductance and capacitance values can be determined as appropriate so that the resonance frequency of this parallel resonant circuit can be set to a specific frequency and the emitter impedance of the transistor is set at a desired magnitude.

Due to the resonance of the parallel circuit composed of the inductor L3 and the capacitor C3, the characteristic impedance of the circuit element 30b is infinite at the fundamental frequency. When the circuit element 30b is formed at a semiconductor chip, the length of the wire can be set in, for example, nanometer unit. For this reason, a required characteristic impedance can be easily achieved. For example, at the 2 GHz fundamental frequency, the inductance value of the inductor L3 is approximately 0.98 nH and the capacitance value of the capacitor C3 is approximately 6 pF. By setting the above values, the resonance frequency is determined to be 2 GHz; and the impedance appears sufficiently large at the 2 GHz ideal resonant frequency. The sufficiently large impedance described here is, considering the standardized impedance, more than tenfold of the standardized impedance. In conclusion, when the circuit element 30b is composed of the inductor L3 and the capacitor C3, the impedance appears sufficiently large, similarly to the example of impedance described with reference to FIG. 10.

Operation

Figure 16:
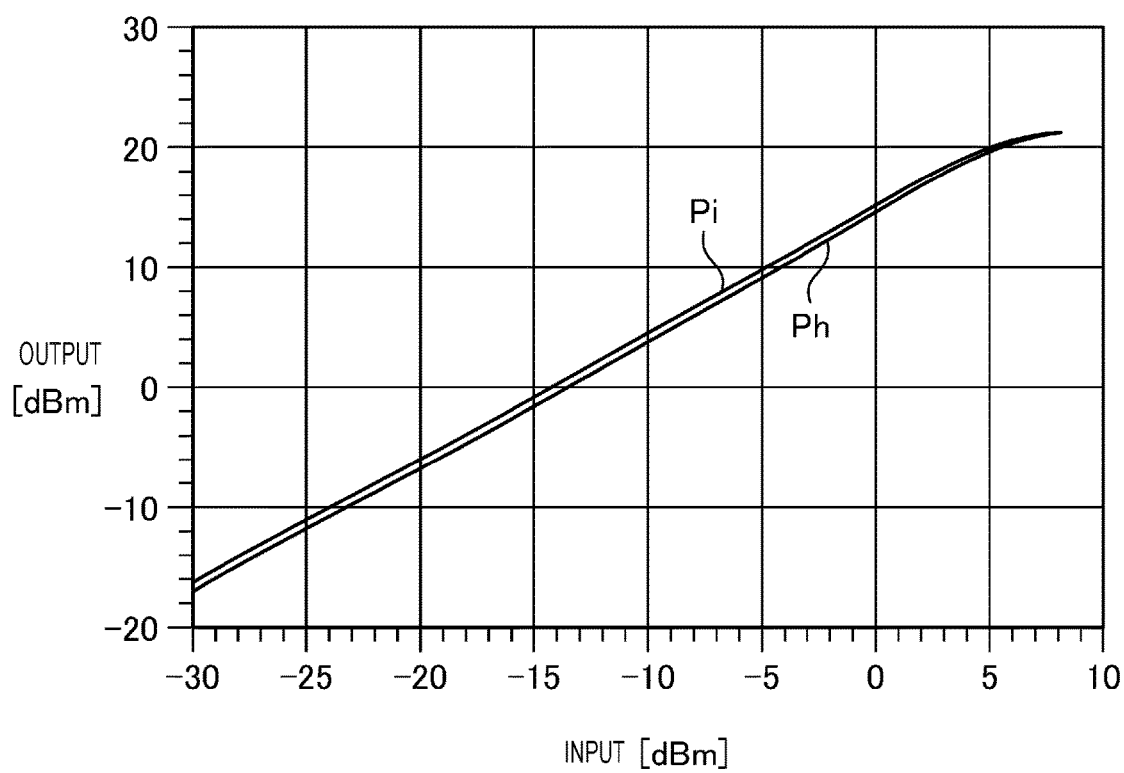
FIG. 16 is a graph illustrating a characteristic of a power amplifier circuit using the active balun circuit illustrated in FIG. 15.

FIGS. 16 to 19 are graphs illustrating characteristics of a power amplifier circuit using the active balun circuit 10c illustrated in FIG. 15. FIG. 16 is a graph illustrating characteristics observed at the nodes N1 and N2 in FIG. 2 when the active balun circuit 10c illustrated in FIG. 15 is used in the power amplifier circuit illustrated in FIG. 2.

FIG. 16 illustrates the relationship between the level of the signal Pi at the node N1 and the level of the signal Ph at the node N2 with respect to the level of the input signal at the input terminal Pin. In FIG. 16, when the level of the input signal at the input terminal Pin changes, the level of the signal Pi and the level of the signal Ph change in a similar manner. The difference between the level of the signal Pi and the level of the signal Ph is significantly small and the unbalanced state of the amplitudes of the signals Pi and Ph is improved. Thus, the differential signals can achieve the symmetry.

Figure 17:
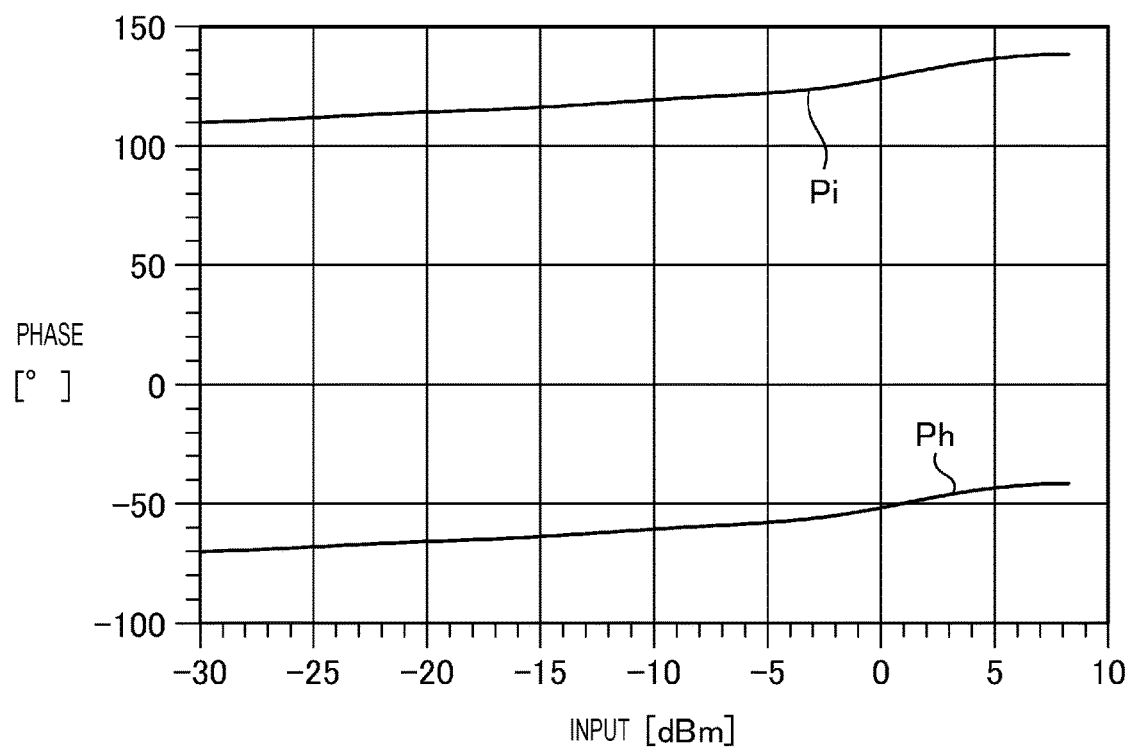
FIG. 17 is a graph illustrating a characteristic of the power amplifier circuit using the active balun circuit illustrated in FIG. 15.
Figure 18:
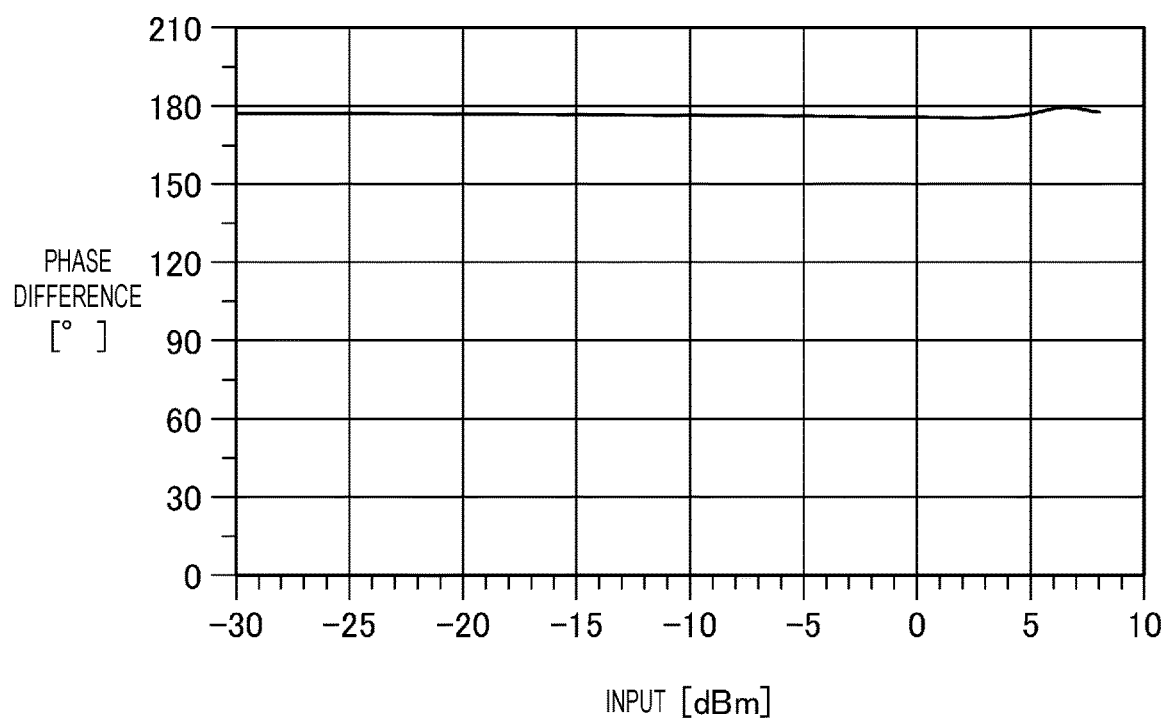
FIG. 18 is a graph illustrating a characteristic of the power amplifier circuit using the active balun circuit illustrated in FIG. 15.

FIG. 17 illustrates the relationship of phase change between the signals Pi and Ph with respect to the level of the input signal at the input terminal Pi. FIG. 18 illustrates the relationship of phase difference between the signals Pi and Ph with respect to the level of the input signal at the input terminal Pin. As can be seen from FIGS. 17 and 18, the signals Pi and Ph change in a similar manner with respect to changes in the signal level of the input signal, and accordingly, the phase difference between the signals Pi and Ph is very close to 180°. Thus, the phase difference between the signals Pi and Ph is further improved.

Figure 19:
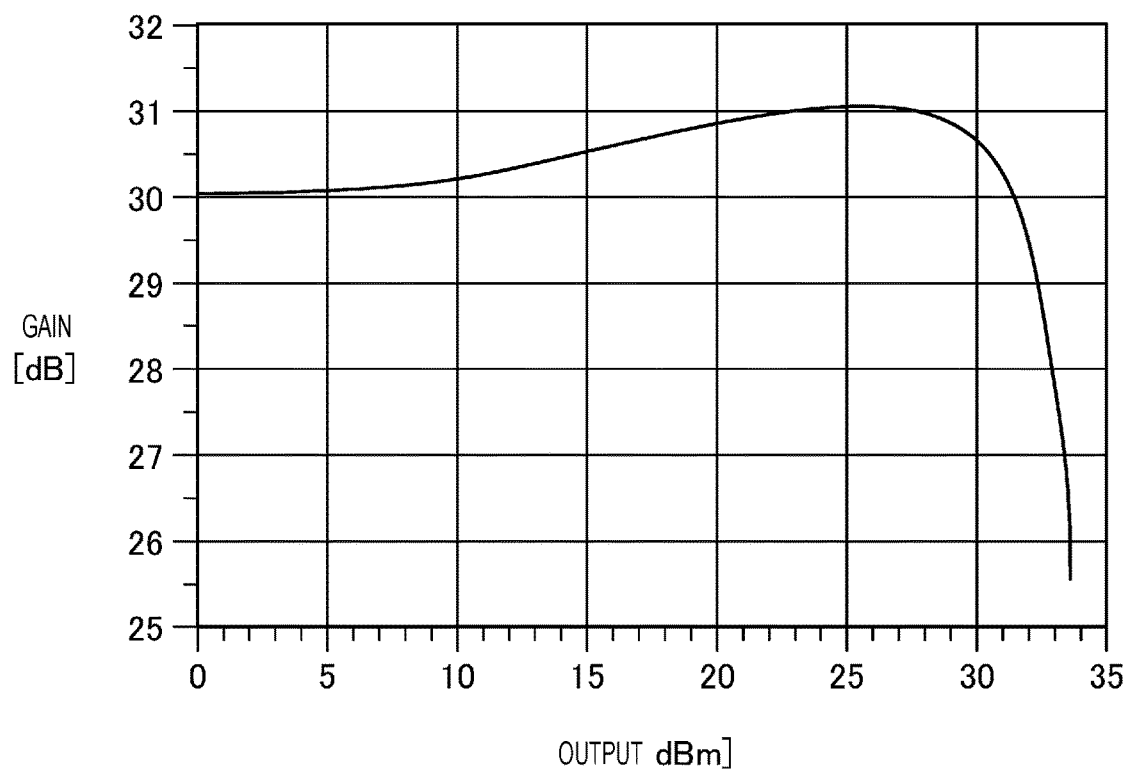
FIG. 19 is a graph illustrating a characteristic of the power amplifier circuit using the active balun circuit illustrated in FIG. 15.

FIG. 19 illustrates the relationship between the level of the signal at the output terminal Pout and the gain of the power amplifier circuit. As illustrated in FIG. 19, when the level of the signal at the output terminal Pout is 30 dBm, a good characteristic can be obtained in which there is almost no drop in gain. As described with reference to FIGS. 17 and 18, the phase difference between the signals Pi and Ph is maintained to be close to 180° and the signal levels of the two signals are almost identical to each other. This means that the two separated transistors in the output stage can be driven under the optimum load condition. As a result, the differential amplifier having a two-stage overall configuration operates under the ideal load condition as illustrated in FIG. 19.

In this regard, the description is made in comparison to the case of the second embodiment. In the second embodiment, the gain steeply drops due to the resistive component of the inductor L3 of the circuit element 30a as illustrated in FIG. 14. This means that, in the second embodiment, the phase difference between the signals Pi and Ph is improved as described with reference to FIGS. 12 and 13. However, since the desired inductor value of the inductor L3 is relatively large, the resistance component relating to the increase in the length of the wire is also significantly large and this results in the increase in the emitter resistance of the transistor in the drive stage; and as a result, as seen from the comparison of the input-output characteristic between FIGS. 5 and 11, there is an adverse effect in which the gain at the drive stage itself is greatly reduced. Thus, the transistors in the output stage cannot be sufficiently driven and the gain of the entire amplifier steeply drops as illustrated in FIG. 14 due to the resistive component of the inductor L3 of the circuit element 30a. By contrast, in the third embodiment, as illustrated in FIG. 19, when the level of the signal at the output terminal Pout is 30 dBm, a good characteristic can be obtained in which there is almost no drop in gain.

Effects

Unlike the balun B illustrated in FIG. 1, the active balun circuit 10c does not include a transformer circuit using wire winding inductors. For this reason, the increase in the area of the semiconductor chip can be suppressed by using the active balun circuit 10c for the power amplifier circuit. Furthermore, in comparison to the active balun circuit 10b, it is possible to reduce the level difference between the differential signals to be outputted and also improve the phase difference between the differential signals, and as a result, an excellent gain characteristic can be achieved. In comparison to the configuration using only wire inductors, the area of the LC tank circuit can be reduced because the LC tank circuit is formed by combining the inductor and the capacitor with each other. For this reason, the circuit can be downsized by using the active balun circuit 10c.

Hereinafter, modified examples of the active balun circuit explained above are described.

First Modified Example

Figure 20:
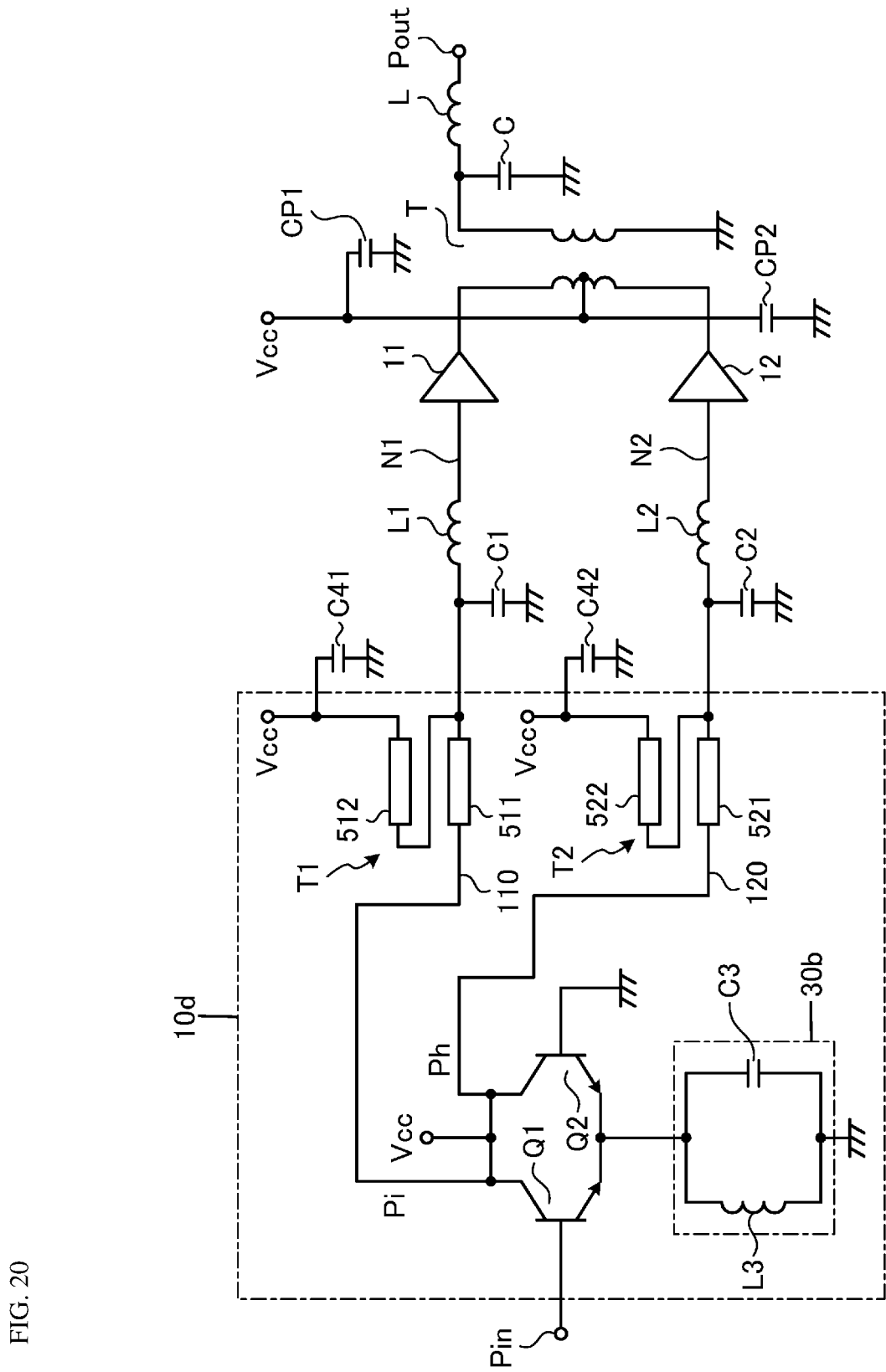
FIG. 20 illustrates a modified example of the power amplifier circuit illustrated in FIG. 2.

FIG. 20 illustrates a modified example of the power amplifier circuit illustrated in FIG. 2. In FIG. 20, the circuit element 30b of an active balun circuit 10d is composed of the inductor L3 and the capacitor C3, similarly to the active balun circuit 10c illustrated in FIG. 15. The inductor L3 and the capacitor C3 are coupled in parallel between the emitter of the transistor Q1 and the emitter of the transistor Q2 and the reference potential. Due to the resonance of the parallel circuit composed of the inductor L3 and the capacitor C3, the characteristic impedance of the circuit element 30b can be set at a relatively large magnitude at the fundamental frequency.

The active balun circuit 10d of the power amplifier circuit of this example includes transmission line transformers T1 and T2. The transmission line transformers T1 and T2 are provided between the final stage of the pair of amplifiers 11 and 12 and the preceding stage, that is, in the transmission lines 110 and 120 between the stages. In other words, the transmission line transformer T1, T2 are provided in the transmission lines 110 and 120 for transmitting a pair of differential signals. The transmission line transformers T1 and T2 has a role of a matching circuit having a function of transforming impedance by causing the magnetic fields created by transmission lines to function as a transformer. Since not using the balun B including windings illustrated in FIG. 1 creates some space in the layout of the semiconductor chip, the transmission line transformers T1 and T2 can be provided at the semiconductor chip.

The transmission line transformer T1 is composed of wires 511 and 512. The wire 511 is coupled in series with between the collector of the transistor Q1 and the amplifier 11. The wires 511 and 512 are adjacent to each other. One end of the wire 512 is coupled to one end of the wire 511 and the other end of the wire 512 is coupled to the supply voltage Vcc. The capacitor C41 functions as a bypass capacitor.

The transmission line transformer T2 is composed of wires 521 and 522. The wire 521 is coupled in series with between the collector of the transistor Q2 and the amplifier 12. The wires 521 and 522 are adjacent to each other. One end of the wire 522 is coupled to one end of the wire 521 and the other end of the wire 522 is coupled to the supply voltage Vcc. The capacitor C42 functions as a bypass capacitor.

Usually, by incorporating the transmission line transformers T1 and T2 in the power amplifier circuit, impedance matching in wide frequency ranges with low loss can be easily achieved between the transistor Q1 and Q2 and the amplifiers 11 and 12. As a result, it is possible to implement a high-performance power amplifier circuit with wider frequency ranges and a high gain characteristic. While in the configuration described above the transmission line transformers T1 and T2 are provided in the transmission lines 110 and 120 between the stages, the transmission line transformers and the balun may be provided on the output matching side after the transistors in the output stage.

Second Modified Example

Figure 21:
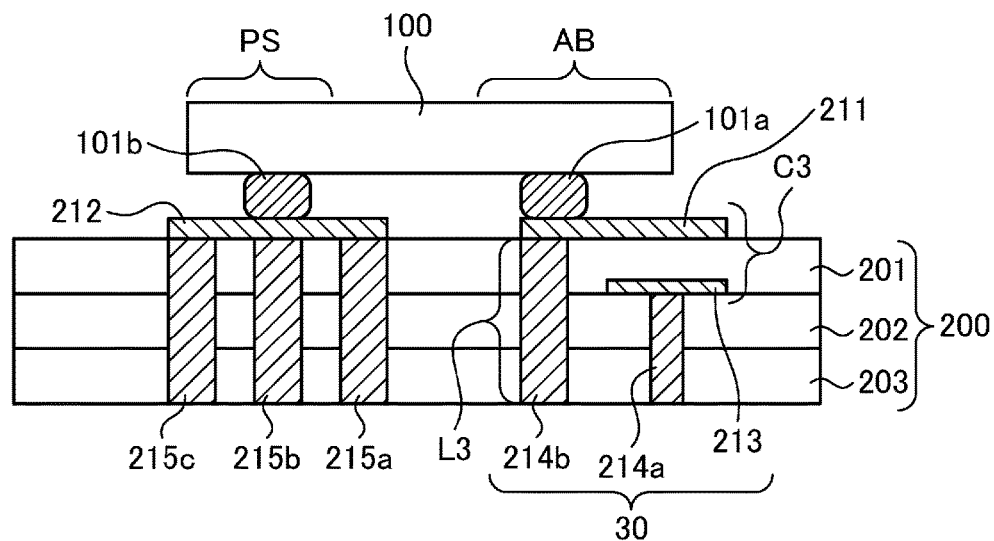
FIG. 21 illustrates an example of a power amplifier module having a semiconductor chip including the active balun circuit of the present disclosure.

FIG. 21 illustrates an example of a power amplifier module having a semiconductor chip including the active balun circuit of the present disclosure. In the power amplifier module illustrated in FIG. 21, a semiconductor chip 100 includes the active balun circuit of the present disclosure. However, among the components of the active balun circuit, the circuit element 30 is formed at a multilayer substrate 200 as will be described later. FIG. 21 schematically illustrates a structure of layers.

As illustrated in FIG. 21, the semiconductor chip 100 has an active balun region AB in which the active balun circuit is formed and an amplifier circuit region PS in which an amplifier circuit is formed. The semiconductor chip 100 also has bumps 101a and 101b. The bumps 101a and 101b are, for example, copper pillar bumps (CPBs) but not limited to this instance.

The multilayer substrate 200 includes dielectric layers 201, 202, and 203. The dielectric layer 201 includes electrodes 211 and 212 provided at positions corresponding to the bumps 101a and 101b. The semiconductor chip 100 is electrically coupled to the electrodes 211 and 212 via the corresponding bumps 101a and 101b. Via holes 215a, 215b, and 215c penetrating the dielectric layers 201, 202, and 203 are connected to the electrode 212.

The dielectric layer 202 has an electrode 213 at a position facing a part of the electrode 211. The electrodes 211 and 213 face each other with the dielectric layer 201 interposed therebetween and function as the capacitor C3. A via hole 214a penetrating the dielectric layers 202 and 203 is connected to the electrode 213. A via hole 214b penetrating the dielectric layers 201, 202, and 203 is connected to the electrode 211. The via hole 214b functions as the inductor L3 in high frequency ranges. The inductor L3 is not limited to the via hole 214b but may be formed as a conductive wire connected to the via hole 214b.

With such a configuration, the semiconductor chip 100 is electrically coupled to the multilayer substrate 200. Instead of providing the circuit element 30 in the active balun circuit, the circuit element 30 is constructed by using the multilayer substrate 200. In this configuration, the semiconductor chip 100 excludes the circuit element 30 and includes the remaining part of the active balun circuit, while the multilayer substrate 200 includes the circuit element 30 having the inductor L3 and the capacitor C3. In other words, the multilayer substrate 200 includes the circuit element 30, which is one of the components of the active balun circuit, and as a result, the circuit element 30 suitable for the active balun circuit can be provided outside the active balun circuit. This makes it possible to downsize the semiconductor chip 100. Also, in this example, similarly to, for example, FIG. 10, the impedance of the circuit element 30 appears sufficiently large at the fundamental frequency.

Third Modified Example

Figure 22:
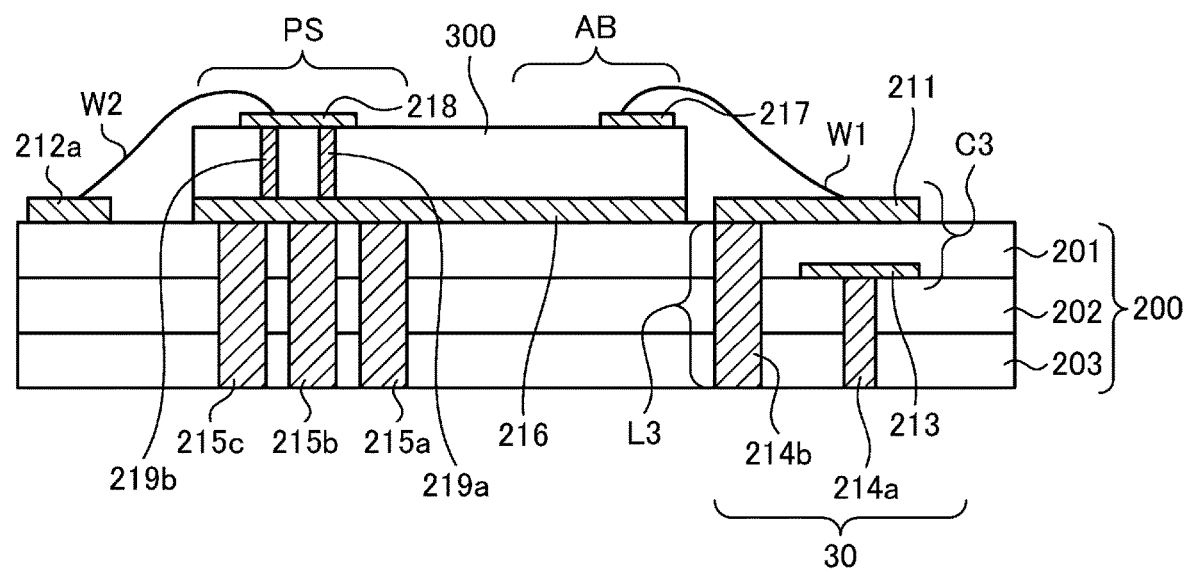
FIG. 22 illustrates an example of another power amplifier module having a semiconductor chip including the active balun circuit of the present disclosure.

FIG. 22 illustrates an example of another power amplifier module having a semiconductor chip including the active balun circuit of the present disclosure. In the power amplifier module illustrated in FIG. 22, a semiconductor chip 300 includes the active balun circuit of the present disclosure. However, among the components of the active balun circuit, the circuit element 30 is formed at a multilayer substrate 200 as will be described later. FIG. 22 schematically illustrates a structure of layers.

As illustrated in FIG. 22, the semiconductor chip 300 has the active balun region AB in which the active balun circuit is formed and the amplifier circuit region PS in which an amplifier circuit in the output stage is formed. The semiconductor chip 300 includes electrodes 216, 217, and 218. The electrode 218 is electrically coupled to the electrode 216 formed on the back side of the semiconductor chip 300 via via holes 219a and 219b penetrating the semiconductor chip 300. The electrode 216 is electrically coupled to the via holes 215a, 215b, and 215c. Since a transistor in the output stage usually deals with large electric power, the via holes 215a, 215b, and 215c have a role of thermal vias having the heat dissipation ability. The electrode 217 is electrically coupled to the electrode 211 formed on a surface of the dielectric layer 201 through a bonding wire W1. The electrode 218 is electrically coupled to an electrode 212a formed on a surface of the dielectric layer 201 through a bonding wire W2.

Similarly to the case in FIG. 21, the electrodes 211 and 213 face each other with the dielectric layer 201 interposed therebetween and function as the capacitor C3. Additionally, similarly to the case in FIG. 21, the via hole 214b is coupled to the electrode 211. The via hole 214b functions as the inductor L3 in high frequency ranges.

With such a configuration, the semiconductor chip 300 is electrically coupled to the multilayer substrate 200. Instead of providing the circuit element 30 in the active balun circuit, the circuit element 30 is constructed by using the multilayer substrate 200. In this configuration, the semiconductor chip 300 excludes the circuit element 30 and includes the remaining part of the active balun circuit, while the multilayer substrate 200 includes the circuit element 30 having the inductor L3 and the capacitor C3. In other words, the multilayer substrate 200 includes the circuit element 30, which is one of the components of the active balun circuit, and as a result, the circuit element 30 suitable for the active balun circuit can be provided outside the active balun circuit. This makes it possible to downsize the semiconductor chip 300. Moreover, the multilayer substrate 200 can be fabricated in less steps than those for the semiconductor chip 300, so that the time for design can also be shortened. Further, characteristics can be fine-controlled by, for example, making combined use of bonding wires or changing mounting positions of bonding wires. Also, in this example, similarly to, for example, FIG. 10, the impedance of the circuit element 30 appears sufficiently large at the fundamental frequency.

Fourth Modified Example

In the second and third embodiments described above, the circuit elements 30a and 30b as lumped constant circuits are used. The present disclosure is not limited to a lumped constant circuit but may use a circuit element as a distributed constant circuit. For example, the wire 30h of a particular length is provided between the connection point of the emitter of the transistor Q1 and the emitter of the transistor Q2 and the reference potential in FIG. 4. Taking parasitic wiring capacitance and parasitic wiring inductance into account, it can be considered that the wire 30h forms a distributed constant circuit. Thus, the wire 30h can be considered as a distributed constant circuit with a particular characteristic impedance. Accordingly, instead of using the circuit elements 30a and 30b as lumped constant circuits, using the wire between the connection point between the emitters and the reference potential can achieve high impedance depending on the fundamental frequency. When the wave length of the fundamental frequency is λ, the length of the wire 30h can be λ/4. In other words, with respect to the fundamental frequency, the wire 30h of a ¼ length of the wave length is provided as a circuit element. It should be noted that, due to the wave length reduction effect by the relative permittivity of the semiconductor substrate, the length is not a ¼ wave length in free space but a ¼ wave length as an electric length. For example, when the fundamental frequency ranges from 30 GHz to 650 MHz, λ/4 ranges from approximately 0.7 mm to approximately 58 mm. The length of the wire 30h is not limited to a ¼ wave length but may be an n/4 wave length, where n is an odd number equal to or greater than 3.

Figure 23:
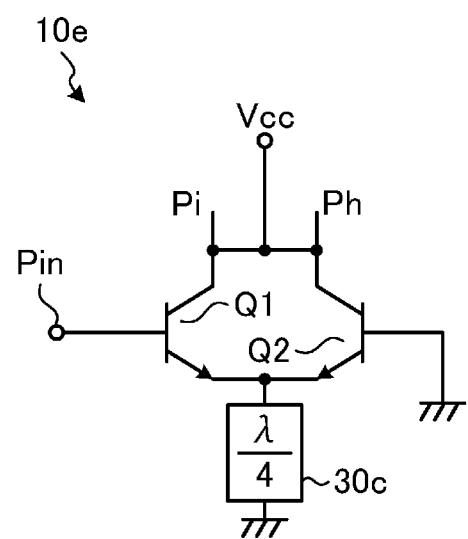
FIG. 23 illustrates an example of an equivalent circuit of an active balun circuit using a distributed constant circuit.

FIG. 23 illustrates an example of an equivalent circuit of an active balun circuit using a distributed constant circuit. In FIG. 23, a circuit element 30c implemented by a wire as a distributed constant circuit exists between the connection point of the emitter of transistor Q1 and the emitter of transistor Q2 and the reference potential. The impedance of the circuit element 30c appears sufficiently large at the fundamental frequency. An active balun circuit 10e illustrated in FIG. 23 is not a balun including winding inductors but a balun implemented by using the transistors Q1 and Q2 and the circuit element 30c.

As described above, using the active balun circuit of this disclosure can downsize the semiconductor chip and also achieve the symmetry of differential signals.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. An active balun circuit comprising:
a first transistor and a second transistor that are configured to output a pair of differential signals corresponding to an input signal; and
a circuit element directly coupled to a reference potential that is configured to have an impedance at a first frequency that is at least tenfold greater than impedances at other frequencies.

2. The active balun circuit according to claim 1, wherein:
the first transistor includes a first terminal coupled to the reference potential via the circuit element, a second terminal coupled to an input terminal, and a third terminal coupled to a supply voltage terminal,
the second transistor includes a first terminal coupled to the reference potential via the circuit element, a second terminal coupled to the reference potential, and a third terminal coupled to the supply voltage terminal, and
the first transistor and the second transistor are configured to output the pair of differential signals from the third terminal of the first transistor and from the third terminal of the second transistor.

3. The active balun circuit according to claim 2, wherein:
the first terminal of the first transistor is an emitter,
the second terminal of the first transistor is a base,
the third terminal of the first transistor is a collector,
the first terminal of the second transistor is an emitter,
the second terminal of the second transistor is a base, and
the third terminal of the second transistor is a collector.

4. The active balun circuit according to claim 2 wherein the circuit element comprises:
an inductor having a first end coupled to a node between the first terminal of the first transistor and the first terminal of the second transistor, and a second end coupled to the reference potential.

5. The active balun circuit according to claim 2, wherein the circuit element comprises:
an inductor having a first end coupled to a node between the first terminal of the first transistor and the first terminal of the second transistor, and a second end coupled to the reference potential; and
a capacitor coupled in parallel with the inductor.

6. The active balun circuit according to claim 2, wherein the circuit element comprises a wire having a length that is ¼ of a wave length of a fundamental frequency of the input signal inputted to the input terminal.

7. An active balun circuit comprising:
a circuit element directly coupled to a reference potential;
a first transistor including a first terminal coupled to the reference potential via the circuit element, a second terminal coupled to an input terminal, and a third terminal coupled to a supply voltage terminal; and
a second transistor including a first terminal coupled to the reference potential via the circuit element, a second terminal coupled to the reference potential, and a third terminal coupled to the supply voltage terminal, wherein:
the first terminal of the first transistor is a source or drain,
the second terminal of the first transistor is a gate,
the third terminal of the first transistor is a drain or source,
the first terminal of the second transistor is a source or drain,
the second terminal of the second transistor is a gate,
the third terminal of the second transistor is a drain or source, and
the first transistor and the second transistor are configured to output a pair of differential signals from the third terminal of the first transistor and from the third terminal of the second transistor.

8. A power amplifier circuit comprising:
the active balun circuit according to claim 1; and
a pair of amplifiers configured to receive the pair of differential signals output by the first and second transistors of the active balun circuit.

9. A power amplifier circuit comprising:
the active balun circuit according to claim 7; and
a pair of amplifiers configured to receive the pair of differential signals output by the first and second transistors of the active balun circuit.

10. The power amplifier circuit according to claim 8, wherein:
the active balun circuit further comprises transmission line transformers individually coupled in transmission lines, the transmission lines being configured to transmit the pair of differential signals output by the first and second transistors of the active balun circuit, and
the transmission line transformers are configured to perform impedance matching between the pair of amplifiers and the first and second transistors of the active balun circuit.

11. The power amplifier circuit according to claim 9, wherein:
the active balun circuit further comprises transmission line transformers individually coupled in transmission lines, the transmission lines being configured to transmit the pair of differential signals output by the first and second transistors of the active balun circuit, and
the transmission line transformers are configured to perform impedance matching between the pair of amplifiers and the first and second transistors of the active balun circuit.

12. A power amplifier module comprising:
a semiconductor chip comprising elements of the active balun circuit according to claim 2 other than the circuit element;
a substrate comprising the circuit element of the active balun circuit, the substrate being electrically coupled to the semiconductor chip; and
a pair of amplifiers configured to receive the pair of differential signals output by the first and second transistors of the active balun circuit.

13. A power amplifier module comprising:
a semiconductor chip comprising elements of the active balun circuit according to claim 7 other than the circuit element;
a substrate comprising the circuit element of the active balun circuit, the substrate being electrically coupled to the semiconductor chip; and
a pair of amplifiers configured to receive the pair of differential signals output by the first and second transistors of the active balun circuit.

14. The active balun circuit according to claim 1, wherein the circuit element does not comprise an active circuit element.

15. The active balun circuit according to claim 7, wherein the circuit element does not comprise an active circuit element.

16. The active balun circuit according to claim 1, wherein the circuit element does not comprise a transistor.

17. The active balun circuit according to claim 7, wherein the circuit element does not comprise a transistor.

\* \* \* \* \*